United States Patent
Popp

(10) Patent No.: US 6,825,079 B2
(45) Date of Patent: Nov. 30, 2004

(54) METHOD FOR PRODUCING A HORIZONTAL INSULATION LAYER ON A CONDUCTIVE MATERIAL IN A TRENCH

(75) Inventor: Martin Popp, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/394,932

(22) Filed: Mar. 21, 2003

(65) Prior Publication Data
US 2004/0043560 A1 Mar. 4, 2004

(30) Foreign Application Priority Data
Mar. 21, 2002 (DE) ........................................ 102 12 610

(51) Int. Cl.$^7$ ..................... H01L 21/8242; H01L 21/20; H01L 21/31
(52) U.S. Cl. ....................... 438/243; 438/386; 438/788; 438/792
(58) Field of Search ................................ 438/243, 386, 438/788, 792

(56) References Cited

U.S. PATENT DOCUMENTS

| | | | | |
|---|---|---|---|---|
| 5,395,786 | A | * | 3/1995 | Hsu et al. ............... 438/248 |
| 6,074,909 | A | | 6/2000 | Gruening |
| 6,177,698 | B1 | | 1/2001 | Gruening et al. |
| 6,184,091 | B1 | | 2/2001 | Gruening et al. |
| 6,184,107 | B1 | | 2/2001 | Divakaruni et al. |
| 6,326,262 | B1 | | 12/2001 | Temmler et al. |
| 6,355,529 | B2 | * | 3/2002 | Heo et al. ................ 438/270 |
| 6,432,774 | B2 | * | 8/2002 | Heo et al. ................ 438/270 |
| 6,599,840 | B2 | * | 7/2003 | Wu et al. ................ 438/705 |
| 2002/0066917 | A1 | * | 6/2002 | Jaiprakash et al. ........ 257/301 |
| 2002/0137278 | A1 | | 9/2002 | Temmler et al. |
| 2002/0187648 | A1 | * | 12/2002 | Wu et al. ................ 438/745 |

FOREIGN PATENT DOCUMENTS

| | | |
|---|---|---|
| DE | 199 41 147 A1 | 3/2001 |
| DE | 199 41 148 A1 | 4/2001 |

* cited by examiner

Primary Examiner—Alexander Ghyka
(74) Attorney, Agent, or Firm—Laurence A. Greenberg; Werner H. Stemer; Gregory L. Mayback

(57) ABSTRACT

In order to form an oxide cover on a conductive filling in a trench in a semiconductor substrate an HDP oxide is deposited on the conductive filling using a PECVD method. In this case, the layer thickness on the horizontal surface of the conductive material is greater than the layer thickness on the sidewalls of the trench. Furthermore, the layer thickness is limited in such a way that the surface of the HDP oxide within the trench has a depth with respect to the surface of the semiconductor substrate surrounding the trench, or a layer disposed thereon. In a subsequent CMP step, the HDP oxide is removed from the surrounding surface. In an isotropic etching step, the HDP oxide is removed from the sidewalls. The result is a horizontal insulation layer with a layer thickness that varies only to a slight extent over the semiconductor substrate.

11 Claims, 4 Drawing Sheets

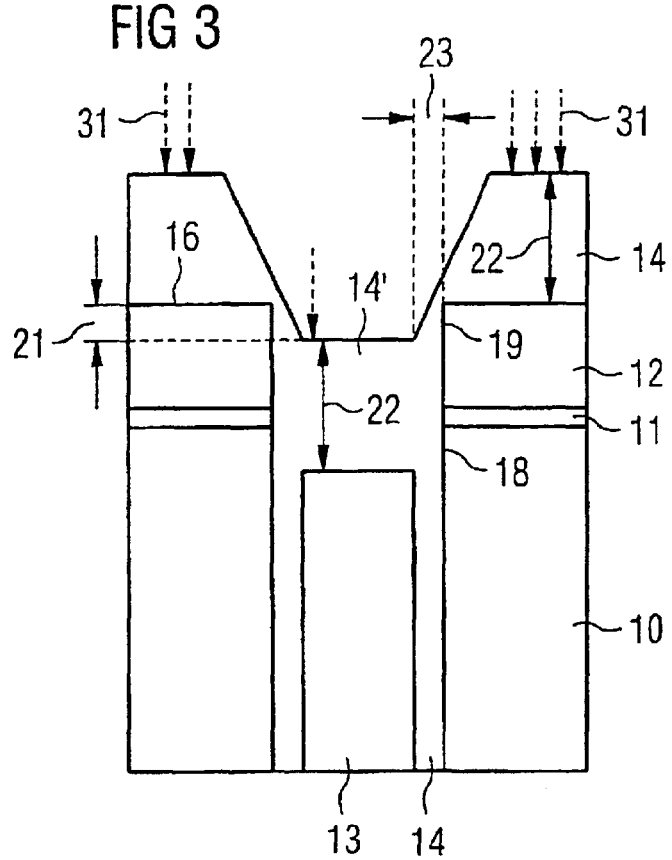
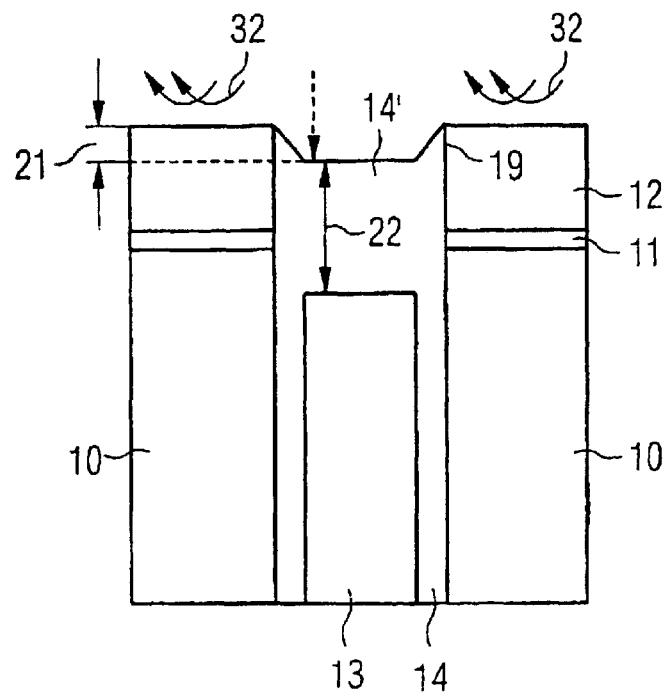

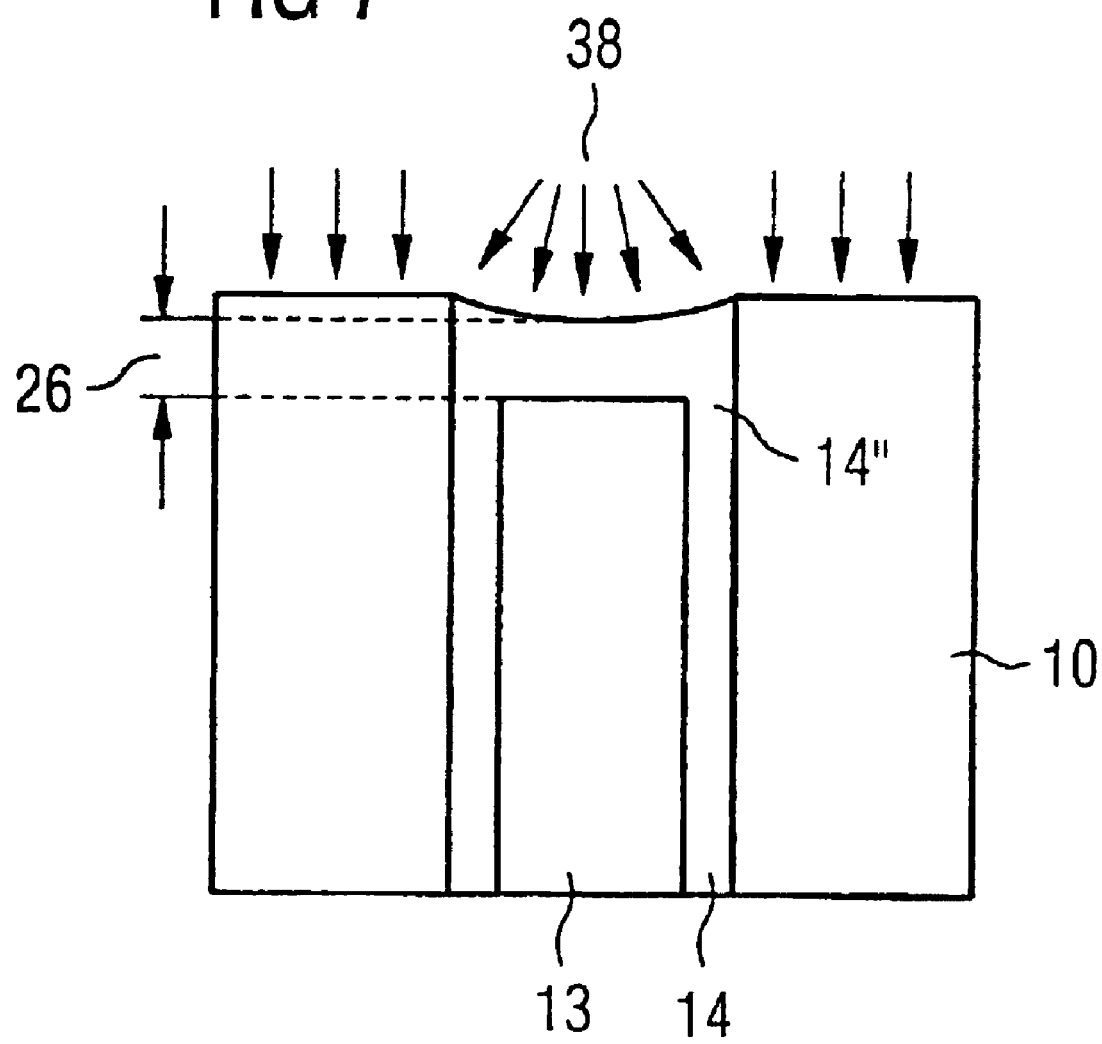

METHOD FOR PRODUCING A HORIZONTAL INSULATION LAYER ON A CONDUCTIVE MATERIAL IN A TRENCH

BACKGROUND OF THE INVENTION

FIELD OF THE INVENTION

The invention relates to a method for producing a horizontal insulation layer on a conductive material within a trench formed in a semiconductor substrate. The horizontal insulation layer also involves, in particular, so-called oxide covers for electrically insulating the conductive trench filling from components applied on the semiconductor substrate.

Trenches are formed in a semiconductor substrate for example in order to provide trench capacitors having the highest possible capacitance for memory cells in an integrated circuit. A typical memory cell contains a selection transistor with a gate terminal, a source terminal and a drain terminal. The gate is connected to a word line, so that it is possible to control the conductivity of the channel region of the transistor, the channel region lies below the gate in the substrate. By way of example, the source terminal in the substrate on one side of the channel region is connected to a bit line contact for the read-out of a memory information item. The drain terminal on the other side of the channel region in the substrate, which has the same conductivity type as the source terminal but an opposite conductivity type to the channel region, is connected to one of the two capacitor electrodes via a contact.

The trench capacitor essentially contains the conductive trench filling as a first trench electrode, a thin dielectric layer in a lower region of the trench and a counter electrode on the substrate side, the counter electrode usually formed as a doped buried well and is connected to a given potential across a plurality of adjacent trenches. An information item is stored in the memory cell by an electrical charge being read into the conductive filling of the first capacitor electrode in the trench capacitor.

For cost and performance reasons, the aim is often to achieve the highest possible densities of memory cells in an integrated circuit. Therefore it is endeavored to keep the space required by the selection transistor on the semiconductor substrate besides the trench capacitor area as small as possible. Two solutions have been proposed for this purpose: the selection transistor is formed at least partly above the trench in a planar manner—source and drain terminals are at the same level at the surface of the substrate—or within the trench in a vertical configuration—source and drain terminals are disposed one above the other, e.g. in the substrate at the inner wall of the trench. In both cases, the problem arises here that the electrically conductive trench filling which takes up the charge to be stored is not permitted to be directly connected to the overlying gate electrode. Therefore, it is necessary to form an insulation layer to insulate the conductive trench filling from electrically conductive structures disposed on the surface. This also applies, in particular, to the conventional case where, by way of example, a word line that passes the trench above its superficial opening and serves for connecting only adjacent cells has to be insulated from the conductive trench filling of a trench capacitor.

The formation of insulation layers for the above-mentioned embodiments configured as vertical transistors is described for example in U.S. Pat. Nos. 6,177,698 B1, 6,184,091 B1, and 6,074,909. In the document mentioned last, by way of example, an insulation layer is applied in a conformal deposition method on the conductive filling and the sidewalls of the trench, after which a sacrificial layer having a large layer thickness is deposited onto the substrate and into the trench in a manner such that it fills the latter. The layer is subsequently etched back, so that it only covers the planar bottom region and the lower part of the sidewalls covered with the conformal insulating layer in the trench. Afterward, in an isotropic etching step that is carried out selectively with respect to the material of the sacrificial layer, that region of the conformal insulating layer that is not covered by the sacrificial layer is removed, followed by a removal of the sacrificial layer as well. Consequently, the horizontal insulating layer covering the conductive filling of the trench and having the original deposition thickness remains in the bottom region of the trench.

The source and drain regions, the gate oxide and the gate are subsequently formed in the trench by the deposition of a further conductive filling. The method described for forming an insulating layer as an oxide cover in the trench can also be used when fabricating memory cells with planar selection transistors. As is described in Published, Non-Prosecuted German Patent Application DE 199 41 147 A1, corresponding to U.S. Pat. No. 6,326,262, for example, in order to form a space-saving memory cell in which the planar selection transistor is disposed above the trench, a monocrystalline epitaxial layer is grown above the oxide cover—already formed—from the sidewalls of the trench, which epitaxial layer terminates the oxide cover from above. The connection of the underlying conductive filling of the trench capacitor is opened in the further course of the process after the completion of the word lines in a self-aligned manner with respect to the selection transistors, in order to ensure a connection of the trench capacitor to the selection transistor. In the case of such a configuration, also called a device-on-trench cell (DOT cell), particular requirements are made of the properties of the insulating layer as the oxide cover. Specifically, a very small layer thickness must be present, in particular, in order to enable an opening of the insulating layer for the purpose of forming the contact to the conductive filling. In this case, a thickness of 20–30 nm is sought, for example.

In order to avoid a contact with the channel or drain terminals of the selection transistor located laterally above the trench, there must also be a particularly small layer thickness variation for the insulating layer, so that a complete dielectric isolation with respect to the substrate is provided. To that end, the process for the overgrowth of the oxide cover during the selective epitaxy is to be carried out particularly carefully in order to avoid even only very slight defect densities. At the same time, however, the process must be compatible with the overall process in which feature sizes of less than 200 nm are fabricated.

Three approaches have been pursued hitherto for solving the problem:

a.) By way of example, the polysilicon of the trench capacitor filling has been thermally oxidized in order to form the insulation layer. In this case, the problem arises that oxide bridges form between adjacent trench capacitors and lead to an unsatisfactory growth of the epitaxial silicon layer, the so-called bird's beak.

b.) The above-described deposition of a thin oxide layer with subsequent back planarization, the so-called TEOS caps, which, however, lead to a very small process window, accompanied by the high risk of the edge regions of the oxide cover being opened.

c.) The deposition of an oxide layer from a high-density plasma (HDP) with subsequent planarization in a CMP step has additionally been proposed, which, however, disadvantageously leads to large layer thickness variations both within the integrated circuits and with systematic defects across the wafer surface. This makes it considerably more difficult to open the oxide covers for instance in a plasma-chemical process for the contact connection.

SUMMARY OF THE INVENTION

It is accordingly an object of the invention to provide a method for producing a horizontal insulation layer on a conductive material in a trench that overcomes the above-mentioned disadvantages of the prior art devices of this general type, in which an insulation layer is formed in a trench in the case of which a layer thickness to be attained is intended to be achieved with high accuracy in conjunction with particularly small layer thickness variation.

With the foregoing and other objects in view there is provided, in accordance with the invention, a method for producing a horizontal insulation layer. The method includes providing a semiconductor substrate having a surface, a trench, and at least one layer containing silicon nitride or silicon oxide disposed on the surface of the semiconductor substrate. The trench has an upper region with uncovered sidewalls and a lower region filled with a conductive material as far as a first depth below the surface of the semiconductor substrate and forms a conductive layer. An insulating material is deposited onto the semiconductor substrate forming an insulation layer in the trench. A surface of the insulation layer is at a first distance from the sidewalls of the trench and at a second distance from the conductive layer. The first distance is less than the second distance. The insulating material is deposited such that the trench is filled as far as a second depth, which lies below a surface of the layer containing the silicon nitride or the silicon oxide. The insulating material disposed on the layer containing the silicon nitride or the silicon oxide is removed. An isotropic etching of the insulating material of the insulation layer is performed until an amount of the insulating material removed from the surface of the insulation layer is greater than the first distance and less than the second distance. The insulation layer is also removed from the sidewalls of the trench resulting in the insulating layer being a horizontal insulation layer with a given thickness remaining on the conductive layer.

The method according to the invention can be applied to all types of trenches in semiconductor substrates, in particular also to deep trenches forming capacitors with planar or vertical selection transistors which are fabricated in respectively succeeding process steps. The surface of the semiconductor substrate may be covered by one or more layers, in particular oxide and pad nitride layers. The sidewalls of the trench in the substrate provided may already be covered with nitride or oxide layers, etc. in which case the latter may either be disposed completely below a conductive filling situated in the trench, or project at the vertical sidewalls above the surface thereof. In particular, the semiconductor substrate, for example monocrystalline silicon, may also be completely covered by layers both inside the trench and outside.

The sidewalls of the trenches should preferably have an inclination of up to 45 degrees with respect to a normal to the surface formed on the plane substrate or wafer surface surrounding the trench.

What is crucial is that the insulating layer to be formed is intended to provide, with respect to the conductive material disposed below it, a thin insulation provided with small layer thickness variation with respect to a conductive layer—a gate or an interconnect—to be formed above it.

In accordance with the present invention, in order to form the horizontal insulation layer which forms the oxide cover on the conductive trench filling, a deposition method is used in which the deposition profile is configured such that the deposition thickness of the deposited material is larger on horizontal areas than on vertical areas, as are typically present at the edges of structures. Such a deposition profile is at odds, for example, with the conventional conformal deposition, for instance a TEOS method. The advantage is that, in a trench, the horizontal bottom area of the trench is provided with a larger layer thickness than the sidewalls. Given a suitable time setting, the application of an isotropic etching step can advantageously bring about the complete removal of the deposited material at the side-walls of the trench, while a sufficient layer thickness of the material still remains on the bottom area, for instance the conductive trench filling. Such a profile may be produced for example in a physically enhanced chemical deposition process (PECVD) from a high density plasma (HDP) as is also provided in one refinement of the present invention. However, the advantageous method is not restricted to this specific deposition process, rather the person skilled in the art can also select other deposition methods known from the prior art and has the properties mentioned in order to carry out the method according to the present invention.

In accordance with the present invention, the insulating material is deposited onto the semiconductor substrate after the provision of the semiconductor substrate—provided with at least one or more trenches—by the above-described deposition process that has the above-mentioned properties with regard to the layer thicknesses. Since the aim is to achieve a layer thickness that is as precise as possible in accordance with predetermined values after the method steps have been carried out, it is particularly advantageous to perform a deposition by PECVD from an HDP since, depending on the process parameters, the respective layer thickness profile can be controlled very precisely.

According to the invention, the holes, i.e. openings of the trench capacitors, are filled by an as far as possible conformal oxide deposition which produces no voids or density fluctuations or irregularities in the subsequent wet etching steps. This is made possible for example by a HDP deposition, as is also used, for instance, to form a trench isolation (STI, shallow trench isolation). In a densified plasma, argon ions are admixed with the reactants and bring about a sputtering mechanism as a result of the applied electrode potential. The result is what is referred to as a small cap formation with beveled side edges on the steps at the surface of a wafer. If the trench is filled, then the removal at the upper side edges, through the sputtering-back, prevents the formation of such voids.

In accordance with the present invention, the layer thicknesses at the vertical sidewalls and on the conductive filling, which generally has a horizontal surface, are defined by the respective distances between the surface of the deposited layer and the sidewalls or the conductive layer. A particular feature of the present invention is that the insulating material is deposited in such a way that the trench is filled with the insulating material as far as a depth which lies below a layer lying through the surface of the semiconductor substrate or a layer lying on it. If the conductive material in the trench has a surface that is described by a first depth in the trench, then, in order to achieve this property, the horizontal deposition thickness or the distance between the surface of the insulation layer and the conductive material must be less than the first depth. The first depth is measured from the surface of the conductive material as far as the surface that is uncovered prior to the deposition step in accordance with the present invention, for example the HDP method, with respect to subsequent processes. In one advantageous refinement, this is a layer containing silicon nitride, also referred to as a pad nitride, which may serve e.g. as an etching stop for subsequent processes.

The particular advantage of the present invention results from the fact that the subsequent process of removing the insulating material from the uncovered surface, that is to say the semiconductor substrate, a silicon nitride layer or a silicon oxide layer ($SiO_2$) etc. can be carried out without impairing the surface of the insulating material left in the trench. Such a subsequent process is chemical mechanical polishing (CMP), for example. In this case, layer thickness variations have previously been brought about depending on the location on the wafer or the exposure field. Moreover, absolute layer thickness accuracies of 20–30 nm have often not been achieved during the CMP.

After the step of removing the insulating material exclusively outside the trench, the insulating layer is still present only within the trench with a smaller first distance between the surface of the layer and the vertical sidewalls and a second, larger distance between the surface and the conductive material of the trench filling. In order to form an oxide cover that is only disposed horizontally, so that contacts can be created laterally above the oxide cover, the sidewalls must also be freed of the insulating layer. To that end, an isotropic etching step is carried out with a combination of an etching dose and time that precisely uncover the sidewalls but only thin the horizontal layer in a controlled manner. If it is taken into account that the trench depth (first depth) with which the semiconductor substrate is provided can already be implemented by an accurately adjustable etching-back step of polysilicon, for example, then it emerges that, with this etching-back step, the HDP deposition step and the isotropic etching step mentioned last, which is preferably carried out in a wet-chemical fashion using HF, the horizontal layer thickness of the insulation layer or its lower interface with the conductive material and its upper interface, which is still uncovered after the process steps, can be characterized with precisely apportionable process steps. By the present invention, in contrast thereto, the inaccurate process step—which increases the defect density—of superficial removal of the insulation layer portions is advantageously carried out without influencing the layer thickness of the insulation layer in the trench. Consequently, a precisely set target layer thickness is achieved and the layer thickness variations of the insulation layer across the circuit and the wafer are considerably reduced.

Thus, according to the invention, the second distance also denotes the vertical deposition thickness of an HDP oxide at a horizontal area and the first distance also denotes a horizontal deposition thickness of an HDP oxide at a vertical area.

In accordance with an added mode of the invention, there are the steps of forming the insulation layer from silicon dioxide, and the conductive material from polysilicon.

In accordance with an additional mode of the invention, there is the step of forming the semiconductor substrate with an oxide collar disposed on the sidewalls of the trench.

In accordance with another mode of the invention, there is the step of removing the layer containing silicon nitride by etching selectively with respect to silicon dioxide, after performing the isotropic etching step.

In accordance with a further mode of the invention, there are the steps of disposing an oxide layer between the surface of the semiconductor substrate and the layer containing silicon nitride; and removing the oxide layer with a further isotropic etching, after performing the removal of the layer containing silicon nitride.

In accordance with another added mode of the invention, there are the steps of forming a thin dielectric layer in the lower region of the trench, and situating a buried well in the lower region of the trench on a substrate side.

In accordance with another further mode of the invention, there is the step of depositing a further conductive material into the trench above the horizontal insulation layer to form a gate for a vertical transistor after the horizontal insulation layer is produced.

In accordance with a concomitant mode of the invention, there are the steps of growing an epitaxial layer above the horizontal insulation layer; performing a further etching step for producing a contact from the epitaxial layer through the horizontal insulation layer to the conductive material and filling an etched area with a further conductive material; and forming a planar transistor in the epitaxial layer at least partly above the trench.

Background information for the embodiments recited above are found in U.S. Pat. Nos. 6,184,091, 6,177,698, 6,074,909, 6,184,107 and 6,326,262, and in U.S. Patent Application Publication No. 2002/0137278 which are all hereby incorporated by reference.

Other features which are considered as characteristic for the invention are set forth in the appended claims.

Although the invention is illustrated and described herein as embodied in a method for producing a horizontal insulation layer on a conductive material in a trench, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS:

FIG. 3 is a sectional view of the semiconductor structure following still further process steps;

FIG. 4 is a sectional view of the semiconductor structure following additional process steps;

FIG. 7 is a sectional view of the semiconductor structure following final process steps.

Figure 1:
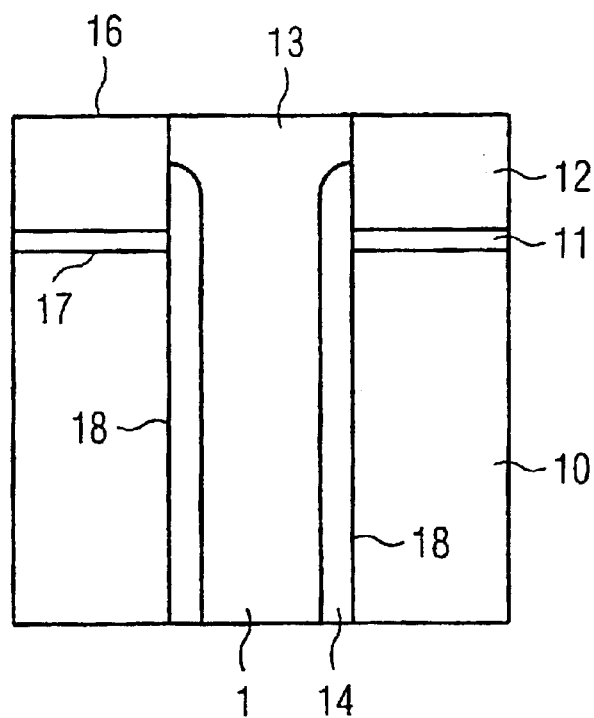
FIG. 1 is a diagrammatic, sectional view of an exemplary embodiment of a semiconductor structure according to the invention.

DESCRIPTION OF THE PREFERRED EMBODIMENTS:

Referring now to the figures of the drawing in detail and first, particularly, to FIG. 1 thereof, there is shown a cross section view through a detail of a semiconductor substrate 10, in which a trench 1 is formed and on which a thin oxide layer 11 and a layer 12 containing silicon nitride (pad nitride hereinafter) are disposed. Oxide collars 14 are deposited on vertical sidewalls 18 of the trench 1. The trench 1 is filled with doped polysilicon as a conductive material 13, which reaches as far as a surface 16 of the pad nitride 12. The semiconductor substrate 10 has a surface 17 adjoining the oxide layer 11.

Figure 2:
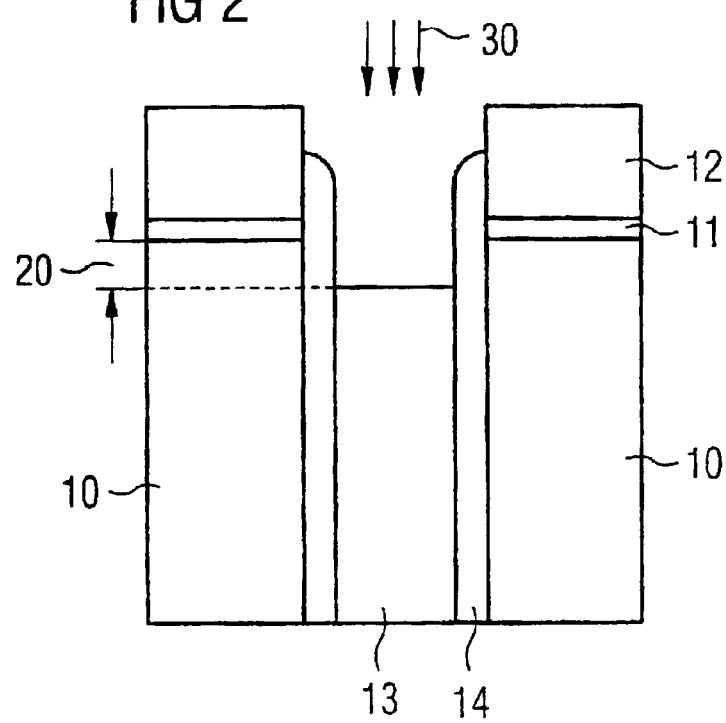
FIG. 2 is a sectional view of the semiconductor structure following further process steps.

FIG. 2 shows the state of the trench 1 after the application of an anisotropic plasma etching step 30, in which the polysilicon 13 is etched back selectively with respect to the pad nitride 12 and the oxide of the oxide collar 14. The etching step is employed with a dose and time such that the surface of the polysilicon 13 reaches a depth 20 of about 30–60 nm below the surface 17. Given a layer thickness of about 150 nm for the combined oxide layer 11 and the pad nitride 12, the result, therefore, is a temporary trench depth of about 200 nm below the upper edge of the pad nitride 12.

FIG. 3 shows the state after the deposition of a HDP oxide 14' by a physical enhanced chemical vapor deposition (PECVD) process. On the horizontal surface, a distance 22 between the surface of the polysilicon 13 and the surface of the deposited HDP oxide layer 14' is 140 nm. Consequently, the surface of the HDP oxide 14' within the trench is situated about 40–70 nm below the upper edge or surface 16 of the pad nitride 12. The deposition of the HDP oxide 14' in a PECVD method has the property of only small layer thicknesses at the vertical sidewalls of structures. As can be seen in FIG. 3, a maximum distance 23 between the surface of the HDP oxide 14' and an upper region 19 of the vertical sidewalls 18 is therefore less than the layer thickness 22 in horizontal sections of the insulation layer 14' or the HDP oxide.

FIG. 4 shows the state of the trench after the application of a chemical mechanical polishing step (CMP) 32. In this case, the insulation layer 14' or the HDP oxide outside the trench 1 has been removed without having impaired the layer thickness 22 or the distance between the surface of the insulation layer 14' and the conductive material 13 within the trench. The trench depth 21 (second depth) to the upper edge or surface 17 of the pad nitride 12 is unchanged at 40–70 nm. During the step of back-planarization of the oxide, the latter is also removed in regions on the wafer that contain no trenches or trench capacitors. The CMP step is carried out selectively with. respect to the pad nitride 12.

Figure 5:
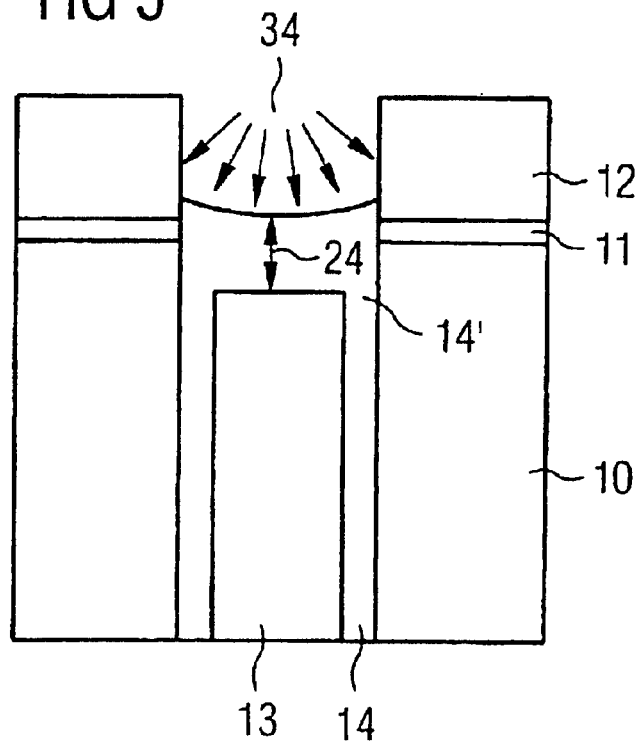
FIG. 5 is a sectional view of the semiconductor structure following additional further process steps.

FIG. 5 shows the state of the trench 1 after the application of an isotropic,. wet-chemical etching-back step of the oxide surface 14' by about 90 nm using HF. A depth of the surface of the insulation layer 14' relative to the surface 16 of the pad nitride 12 is now 130–160 nm. In particular, during the isotropic etching step 34, the layer portions in the upper region 19 of the sidewalls 18 are essentially removed on account of their smaller layer thickness or distances 23.

Figure 6:
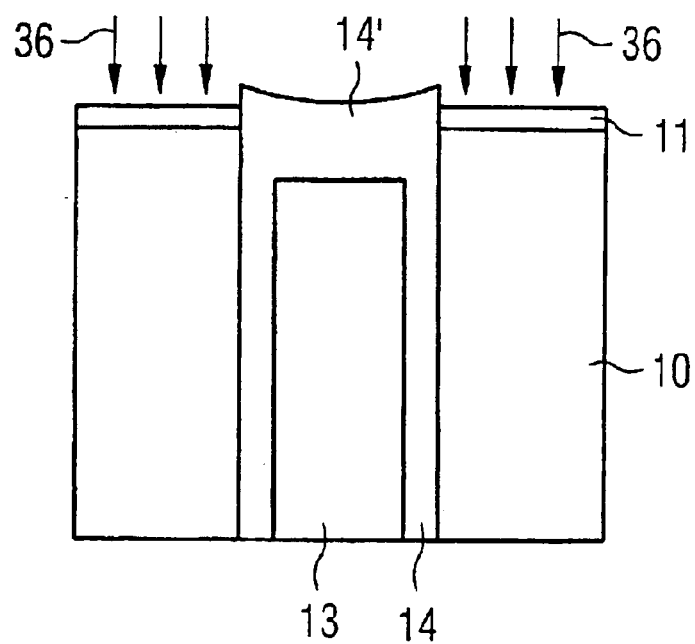
FIG. 6 is a sectional view of the semiconductor structure following still further process steps.

FIG. 6 shows the state of the trench after the removal of the nitride mask by using $H_3PO_4$ in an etching step 36 selectively with respect to the oxide of the oxide layer 11 and the HDP oxide 14' within the trench 1. As can be seen in FIG. 7, the subsequent removal of the pad oxide of the oxide layer 11—once again by use of HF—again realizes an oxide removal of 20 nm, which essentially corresponds to the thickness of the oxide layer 11. A distance 26 of the surface of the insulation layer 14'' after the etching-back step 38 for removing the pad oxide amounts to the new distance 26 (reduced layer thickness) of the thinned insulation layer 14' from the conductive material 13 of only 20–30 nm.

I claim:

1. A method for producing a horizontal insulation layer, which comprises the steps of:

providing a semiconductor substrate having a surface, a trench formed therein, and at least one layer containing a material selected from the group consisting of silicon nitride and silicon oxide disposed on the surface of the semiconductor substrate, the trench having an upper region with uncovered sidewalls and a lower region filled with a conductive material as far as a first depth below the surface of the semiconductor substrate forming a conductive layer;

depositing an insulating material onto the semiconductor substrate forming an insulation layer in the trench, a surface of the insulation layer being at a first distance from the sidewalls of the trench and at a second distance from the conductive layer, the first distance being smaller than the second distance, the insulating material being deposited such that the trench is filled as far as a second depth, which lies below a surface of the layer containing the silicon nitride or the silicon oxide;

removing the insulating material disposed on the layer containing the silicon nitride or the silicon oxide; and performing an isotropic etching of the insulating material of the insulation layer until an amount of the insulating material removed from the surface of the insulation layer being greater than the first distance and less than the second distance, and that the insulation layer being removed from the sidewalls of the trench resulting in the insulating layer being a horizontal insulation layer with a given thickness remaining on the conductive layer.

2. The method according to claim 1, which further comprises:

forming the insulation layer from silicon dioxide; and forming the conductive material from polysilicon.

3. The method according to claim 2, which further comprises carrying out the depositing step for forming the insulation layer, having the first distance from the sidewalls and the second distance from the conductive material, using a physically enhanced chemical vapor deposition method with a high-density plasma.

4. The method according to claim 3, which further comprises carrying out the removing step for removing the insulating material on the layer containing silicon nitride, using a chemical mechanical polishing for removing the silicon dioxide selectively with respect to silicon nitride.

5. The method according to claim 1, which further comprises carrying the isotropic etching with a wet-chemical etching process using HF.

6. The method according to claim 1, which further comprises forming the semiconductor substrate with an oxide collar disposed on the sidewalls of the trench.

7. The method according to claim 6, which further comprises removing the layer containing silicon nitride by etching selectively with respect to silicon dioxide, after performing the isotropic etching step.

8. The method according to claim 7, which further comprises:

disposing an oxide layer between the surface of the semiconductor substrate and the layer containing silicon nitride; and removing the oxide layer with a further isotropic etching, after performing the removal of the layer containing silicon nitride.

9. The method according to claim 8, which further comprises:

forming a thin dielectric layer in the lower region of the trench; and situating a buried well in the lower region of the trench on a substrate side.

10. The method according to claim 1, which further comprises depositing a further conductive material into the trench above the horizontal insulation layer to form a gate for a vertical transistor after the horizontal insulation layer is produced.

11. The method according to claim 1, which further comprises:

growing an epitaxial layer above the horizontal insulation layer;

performing a further etching step for producing a contact from the epitaxial layer through the horizontal insulation layer to the conductive material and filling an etched area with a further conductive material; and forming a planar transistor in the epitaxial layer at least partly above the trench.

* * * * *